United States Patent
Pezzani

(10) Patent No.: US 6,480,056 B1
(45) Date of Patent: Nov. 12, 2002

(54) NETWORK OF TRIACS WITH GATES REFERENCED WITH RESPECT TO A COMMON OPPOSITE FACE ELECTRODE

(75) Inventor: Robert Pezzani, Parcay-Meslay (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/470,304

(22) Filed: Dec. 22, 1999

Related U.S. Application Data

(62) Division of application No. 08/871,734, filed on Jun. 9, 1997, now Pat. No. 6,034,381.

(51) Int. Cl.⁷ ............................................... H03K 17/73
(52) U.S. Cl. ............................................. 327/469; 327/455
(58) Field of Search ................................ 327/438, 439, 327/445, 446, 447, 452, 453, 455, 456, 459, 460–463, 468–476; 257/119, 121, 122, 123

(56) References Cited

U.S. PATENT DOCUMENTS

| | | | |
|---|---|---|---|
| 3,409,810 A | | 11/1968 | Matzen, Jr. ................. 317/235 |
| 3,868,544 A | * | 2/1975 | Banks ......................... 327/456 |
| 3,918,083 A | * | 11/1975 | Kravitz et al. .............. 257/122 |
| 4,117,349 A | * | 9/1978 | Ott ............................. 327/456 |
| 4,613,884 A | | 9/1986 | Angerstein et al. ........... 357/39 |
| 4,939,564 A | * | 7/1990 | Asakura et al. ............. 257/146 |
| 5,036,377 A | * | 7/1991 | Pathak et al. ............... 327/469 |
| 5,179,324 A | * | 1/1993 | Audbert ...................... 327/469 |
| 5,274,524 A | * | 12/1993 | Pezzani et al. ................ 361/56 |
| 5,345,094 A | * | 9/1994 | Usui et al. ................... 257/119 |
| 5,596,292 A | * | 1/1997 | Pezzani ...................... 327/438 |
| 5,608,235 A | * | 3/1997 | Pezzani ...................... 257/119 |
| 6,034,381 A | * | 3/2000 | Pezzani ...................... 257/122 |

FOREIGN PATENT DOCUMENTS

| | | |
|---|---|---|
| EP | 0-652-598 A2 * | 5/1995 |
| EP | A-0 709 891 | 5/1996 |

OTHER PUBLICATIONS

RCA Technical Notes, vol. 2180, No. 1343, Mar. 1984, Princeton, US, pp. 1–6, J.M.S. Neilson and R.A. Duclos, "Avalanche Diode Structure".

* cited by examiner

Primary Examiner—Terry D. Cunningham
Assistant Examiner—Long Nguyen
(74) Attorney, Agent, or Firm—Wolf, Greenfield & Sacks, P.C.; James H. Morris; Robert A. Skrivanek, Jr.

(57) ABSTRACT

The present invention relates to a triac network wherein each triac includes an N-type semiconductor substrate, containing a first thyristor comprised of NPNP regions and a second thyristor comprised of PNPN regions, and surrounded with a P-type deep diffusion. A P-type well contains an N-type region, on the front surface side. A first metallization corresponds to a first main electrode, a second metallization corresponds to a second main electrode, a third metallization covers the N-type region and is connected to a gate terminal, and a fourth metallization connects the P-type well to the upper surface of the deep diffusion.

21 Claims, 4 Drawing Sheets

NETWORK OF TRIACS WITH GATES REFERENCED WITH RESPECT TO A COMMON OPPOSITE FACE ELECTRODE

This application is a division of application Ser. No. 08/871,734, filed Jun. 9, 1997, now U.S. Pat. No. 6,034,381 entitled NETWORK OF TRIACS WITH GATES REFERENCED WITH RESPECT TO A COMMON OPPOSITE FACE ELECTRODE, in which the issue fee has been paid.

BACKGROUND OF THE INVENTION

1. Field of the Invention

The present invention relates to bidirectional switches, currently called triacs, of medium power.

2. Discussion of the Related Art

Generally, a first surface, or rear surface of a triac is meant to be connected to a radiator (heat sink) and is covered with a uniform metallization forming a first main terminal of the triac. The opposite surface, or front surface, is covered with a second metallization of large dimensions forming the second main terminal of the triac, and one or more secondary metallizations, at least one of which forms a control terminal or gate of the triac.

Generally, the control terminal is referenced with respect to the second main terminal located on the same front surface. This can be a disadvantage, especially when it is desired to implement, monolithically or not, several triacs having a common main terminal (first or second) which is generally connected to ground that are also mounted on a radiator. In such an arrangement, the first main terminals (i.e., those on the rear surface) of the several triacs would be connected together and mounted on a common radiator connected to ground. The gates of the several triacs would then be controlled by a signal that is referenced to the second main terminals (i.e., those on the front surface) which are at high and possibly different potentials. To selectively control the different triacs, a control circuit needs to be provided, the reference voltages of which are high and possibly distinct voltages. Thus, the problem of implementing relatively complex control circuits arises. Alternatively, discrete triacs, having their second main terminals (those on the front surface) commonly connected to ground and having their rear surfaces mounted on a radiator for cooling and being at different potentials (which results in the necessity of providing one radiator per triac or isolated assemblies) have to be used.

This situation appears in a great number of devices. For example, in a washing machine, several triacs are used for controlling the pumps, the solenoid-operated filling valves, the various distributors, etc. Such medium power triacs are controlled by the same programmer unit and their main terminals on which the gates are referenced are interconnected. Since these main terminals are disposed on the same side as the gate, it is not possible to implement a monolithic structure and braze the metallization corresponding to the common terminal on a same radiator, because the gate metallizations disposed on the same surface would then be short-circuited. Such configurations are to be found in many other systems, for example, in controls of rolling shutters in which the engines include a coil for the closing of the shutter and another coil for its opening.

SUMMARY OF THE INVENTION

Thus, an object of the present invention is to provide a triac structure such that several triacs can be assembled in a network with a common electrode, the common electrode forming the reference with respect to which the voltage applied to the control electrode is selected.

Another object of the present invention is to provide such a structure for alternating currents wherein the control voltage always has the same biasing with respect to the common reference main terminal, regardless of the biasing on the other main terminal (positive or negative halfwave of the mains voltage).

Another object of the present invention is to provide a monolithic structure incorporating a triac network.

Another object of the present invention is to provide such a monolithic structure which is easy to manufacture with currently used methods for manufacturing thyristors and triacs.

To achieve these objects, the present invention provides a triac network wherein each triac includes a semiconductor substrate of the first type of conductivity having a front surface and a rear surface, a layer of the second type of conductivity on the rear surface side, a deep diffusion of the second type of conductivity connecting the layer to the front surface, a first well of the second type of conductivity containing a first region of the first type of conductivity on the front surface side, a second well of the second type of conductivity on the front surface side, a second region of the first type of conductivity on the rear surface side substantially facing the second well, and a third well of the second type of conductivity containing a third region of the first type of conductivity on the front surface side. A first metallization on the rear surface side corresponds to a first main electrode, a second metallization on the front surface side covers the upper surface of the first region and of the second well and corresponds to a second main electrode, a third metallization covers one of the third well and the third region and is connected to a gate terminal, and a fourth metallization connects the other of the third well and the third region to the upper surface of the deep diffusion.

According to an embodiment of the present invention, all triacs are formed in a same semiconductor substrate and the first metallization is a common metallization covering the rear surface.

According to an embodiment of the present invention, the deep diffusion extends at the circumference of each triac structure.

According to an embodiment of the present invention, the first type of conductivity is type N.

According to an embodiment of the present invention, the control terminal is connected to the third region, and the network further includes means for applying to this control terminal a negative voltage with respect to the potential of the first main electrode.

According to an embodiment of the present invention, the control terminal is connected to the third well, and the network further includes means for applying to this control terminal a positive voltage with respect to the potential of the first main electrode.

These objects, characteristics and advantages as well as others, of the present invention, will be discussed in detail in the following non-limiting description of specific embodiments in relation with the accompanying drawings.

DETAILED DESCRIPTION

Figure 1A:
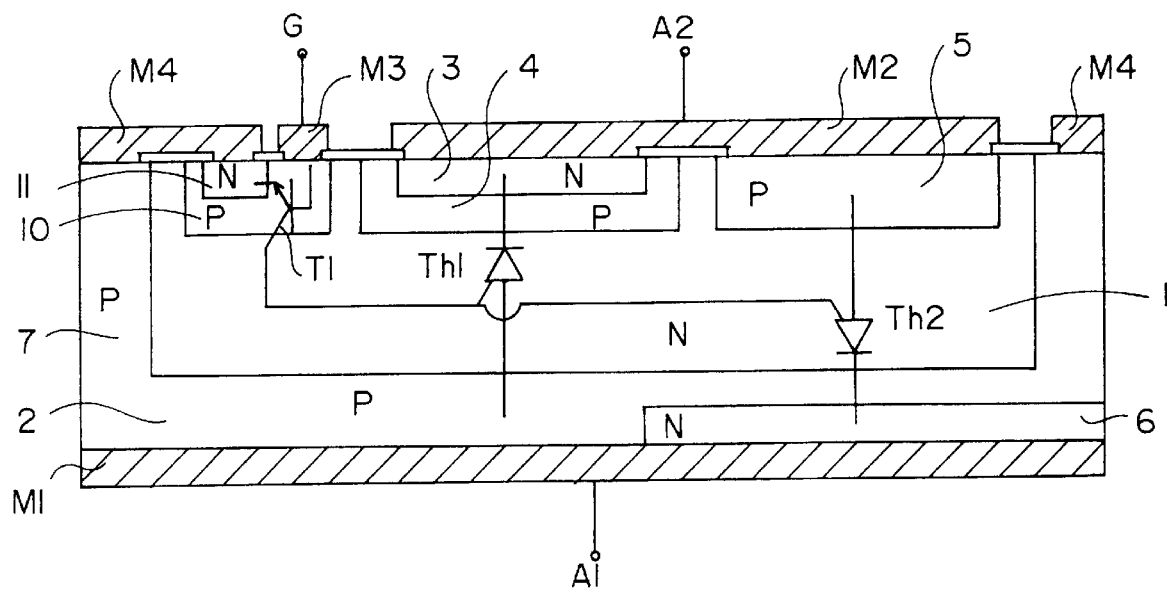
FIG. 1A shows a simplified cross-sectional view of a first embodiment of a triac structure according to the present invention.
Figure 2A:
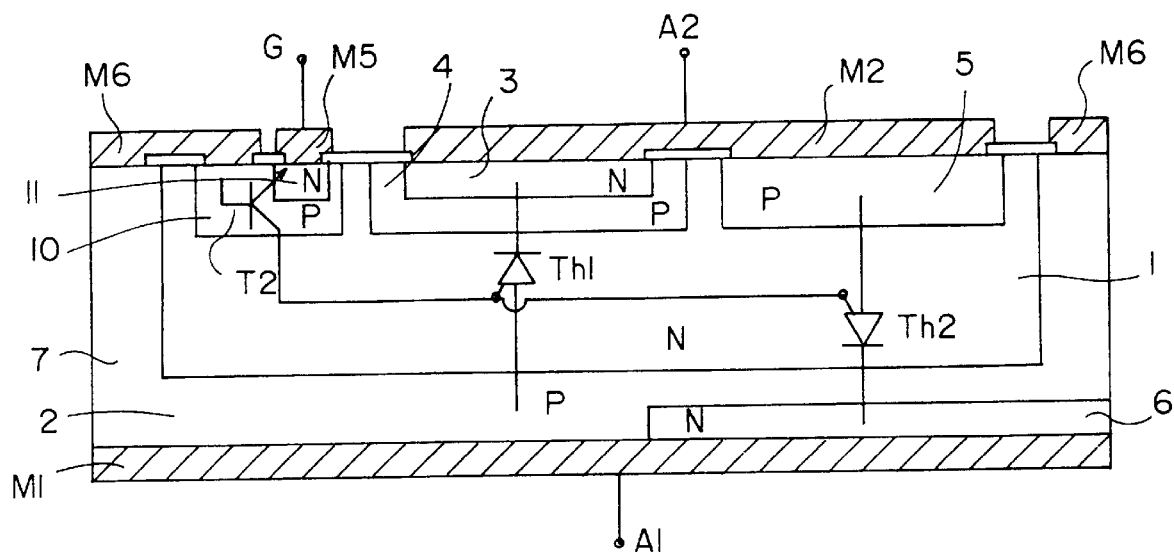
FIG. 2A shows a simplified cross-sectional view of a second embodiment of a triac structure according to the present invention.

As conventionally done in the representation of semiconductor components, the cross-sectional views of FIGS. 1A and 2A are extremely simplified and are not to scale. For an example of a more practical implementation, one should refer to the top views of FIGS. 3A and 3B.

The structure of FIG. 1A is formed based on a lightly doped N-type semiconductor substrate 1. This triac conventionally includes two antiparallel vertical thyristors Th1 and Th2. The anode of thyristor Th1 corresponds to a P-type layer 2 formed on the rear or lower surface side of the substrate. Its cathode corresponds to a region 3 of the second type of conductivity formed on the front or upper surface side in a P-type well 4. The anode of thyristor Th2 corresponds to a P-type well 5 formed on the front or upper surface side and its cathode corresponds to an N-type region 6 formed on the rear or lower surface side in layer 2. This triac is of the so-called well-type, that is, its circumference is comprised of a strongly doped P-type region 7 extending from the front surface to P-type layer 2. Conventionally, region 7 is obtained by deep diffusion from the two surfaces of the substrate. The rear surface is coated with a metallization M1 corresponding to a first main terminal A1 of the triac and the upper surfaces of regions 3 and 5 are coated with a second metallization M2 corresponding to the second main terminal A2 of the triac.

This far, the main aspects of a triac have been described. The present invention differs from other triacs by its triac triggering structure. This triggering structure includes a P-type well 10 formed on the front or upper surface side in which an N-type region 11 is formed.

In the embodiment of FIG. 1A, the surface of well 10 forms one block with a metallization M3 connected to a gate terminal G of the triac and the surface of region 11 is connected by a metallization M4 to the upper surface of peripheral deep diffusion 7.

In further reference to FIG. 1A, the symbols of different components resulting from the structure shown have also been shown. Thus, above-mentioned thyristors Th1 and Th2 have been shown, as well as a transistor T1, the base of which corresponds to region 10 and to gate metallization G, the emitter of which corresponds to region 11 and metallization M4 (that is, this emitter is connected by well 7 and metallization M4 to the first main electrode A1 of the rear or lower surface of the triac), and the collector of which corresponds to substrate 1, that is, to the anode gate regions of thyristors Th1 and Th2.

Figure 1B:
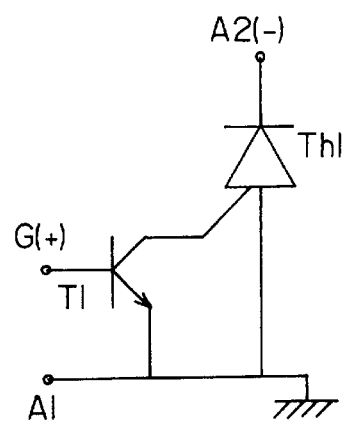
FIG. 1B shows an equivalent diagram of the first embodiment when the main front surface terminal is at a lower potential than the main rear surface terminal.

The triac operates as follows. When terminal A2 is negative with respect to terminal A1, thyristor Th1 can be turned on. The equivalent diagram is then that of FIG. 1B. If a positive voltage with respect to that of rear or lower surface electrode A1 is applied to terminal G, for example, a voltage of approximately 6 volts, a current flows between terminals G and A1 through the base-emitter junction of transistor T1. This base-emitter current causes the flowing of a collector-emitter current through transistor T1 and thus the flowing of a current between the anode and the anode gate of thyristor Th1 which is then turned on. Another explanation for the turning-on of thyristor Th1 is the fact that the base-emitter junction of transistor T1 becoming conductive results in the generation of charges in the vicinity of the junction between substrate 1 and region 4, that is, a turning-on of thyristor Th1 by unblocking its blocking junction between substrate 1 and region 4.

Figure 1C:
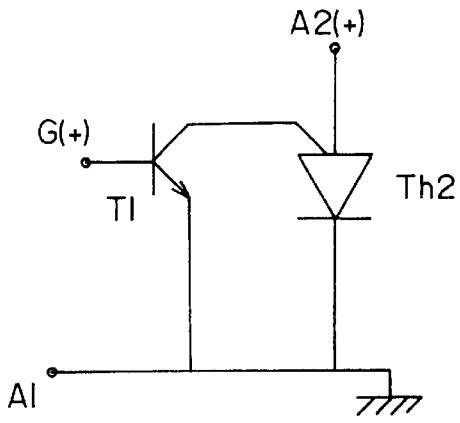
FIG. 1C shows an equivalent diagram of the first embodiment when the main front surface terminal is at a higher potential than the main rear surface terminal.

When terminal A2 is positive with respect to terminal A1, thyristor Th2 can be turned on. The equivalent diagram is then that of FIG. 1C. If a positive voltage with respect to that of rear or lower surface electrode A1 is applied to terminal G, for example, a voltage of approximately 6 volts, a current flows between terminals G and A1 through the base-emitter junction of transistor T1. This transistor becomes conductive and a current flows from terminal A2, via the anode/anode gate junction of thyristor Th2, and then through transistor T1, to terminal A1. In this case, transistor T1 operates normally (i.e., as an amplifier) and the anode gate current is substantially equal to the injected base current multiplied by the transistor gain.

Thus, a triac structure in which the control electrode G is disposed on the front surface but in which the triac is triggered by applying on terminal G a voltage having a given polarity (positive) with respect to the voltage of the rear surface electrode (A1) is obtained.

FIG. 2A shows a simplified cross-sectional view of a second embodiment of the present invention. The structure of the different areas formed in the semiconductor substrate is identical to that illustrated in FIG. 1A. The difference between the two drawings is that region 11 is connected to a metallization M5 connected to gate G and that well 10 is connected by a metallization M6 to peripheral deep diffusion 7.

Thus, a NPN-type transistor T2 is formed, the emitter of which corresponds to region 11 and is connected by metallization M5 to gate G, the base of which corresponds to well 10 and is connected by metallization MG and deep diffusion 7 to terminal A1, and the collector of which corresponds to substrate 1, that is, to the anode gates of thyristors Th1 and Th2.

The operation of this second embodiment of the present invention will be described in relation with FIGS. 2B and 2C which show equivalent diagrams in the case where terminal A2 is negative with respect to terminal A1, for example at ground, and in the case where terminal A2 is positive with respect to terminal A1, respectively.

Figure 2B:
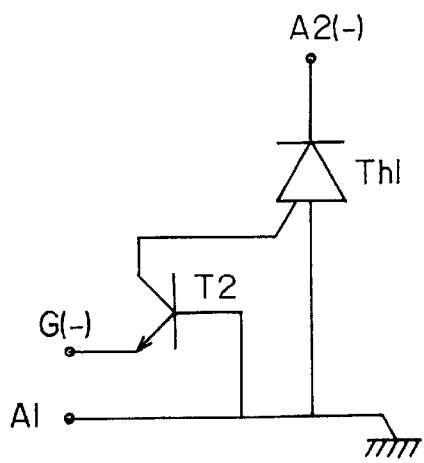
FIG. 2B shows an equivalent diagram of the second embodiment when the main front surface terminal is at a lower potential than the main rear surface terminal.

As is shown in FIG. 2B, if, while terminal A2 is negative with respect to terminal A1, a negative voltage is applied to the gate, the base-emitter junction of transistor T2 becomes conductive and makes the transistor T2 conductive. As a result, a current flows from terminal A1 to the anode/anode gate junction of thyristor Th1 and, via transistor T2, to gate terminal G. Transistor T2 normally operates as an amplifier.

Figure 2C:
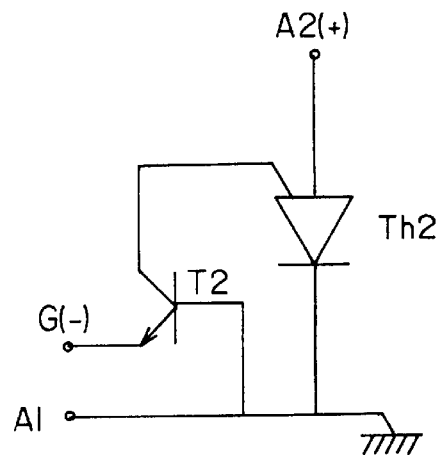
FIG. 2C shows an equivalent diagram of the second embodiment when the main front surface terminal is at a higher potential than the main rear surface terminal.

Similarly, in the case of FIG. 2C where terminal A2 is positive with respect to terminal A1, the application of a negative voltage on terminal G makes transistor T2 conductive by circulating a base-emitter current, after which a current flows from terminal A2 to the anode/anode gate junction of thyristor Th2, and then through transistor T2 to terminal G. Transistor T2 also normally operates as an amplifier.

In practice, this second embodiment of the present invention, where, in both cases, transistor T2 operates as an amplifier and where the control is more sensible, is preferred. This has been established by way of experiment by the present inventor.

As indicated previously, an aim of the present invention is to implement triacs which can be assembled in a network of triacs, each of which is connected to the others by way of a surface which is opposite to the surface upon which the gate metallization is formed. This is precisely what the present invention obtains.

Several primary triacs such as that of FIG. 1A or 2A can be assembled by brazing of their metallizations M1 on a same grounded radiator or, preferably, several triacs such as that of FIG. 1A or 2A can be implemented monolithically in a same semiconductor substrate.

Figure 3A:
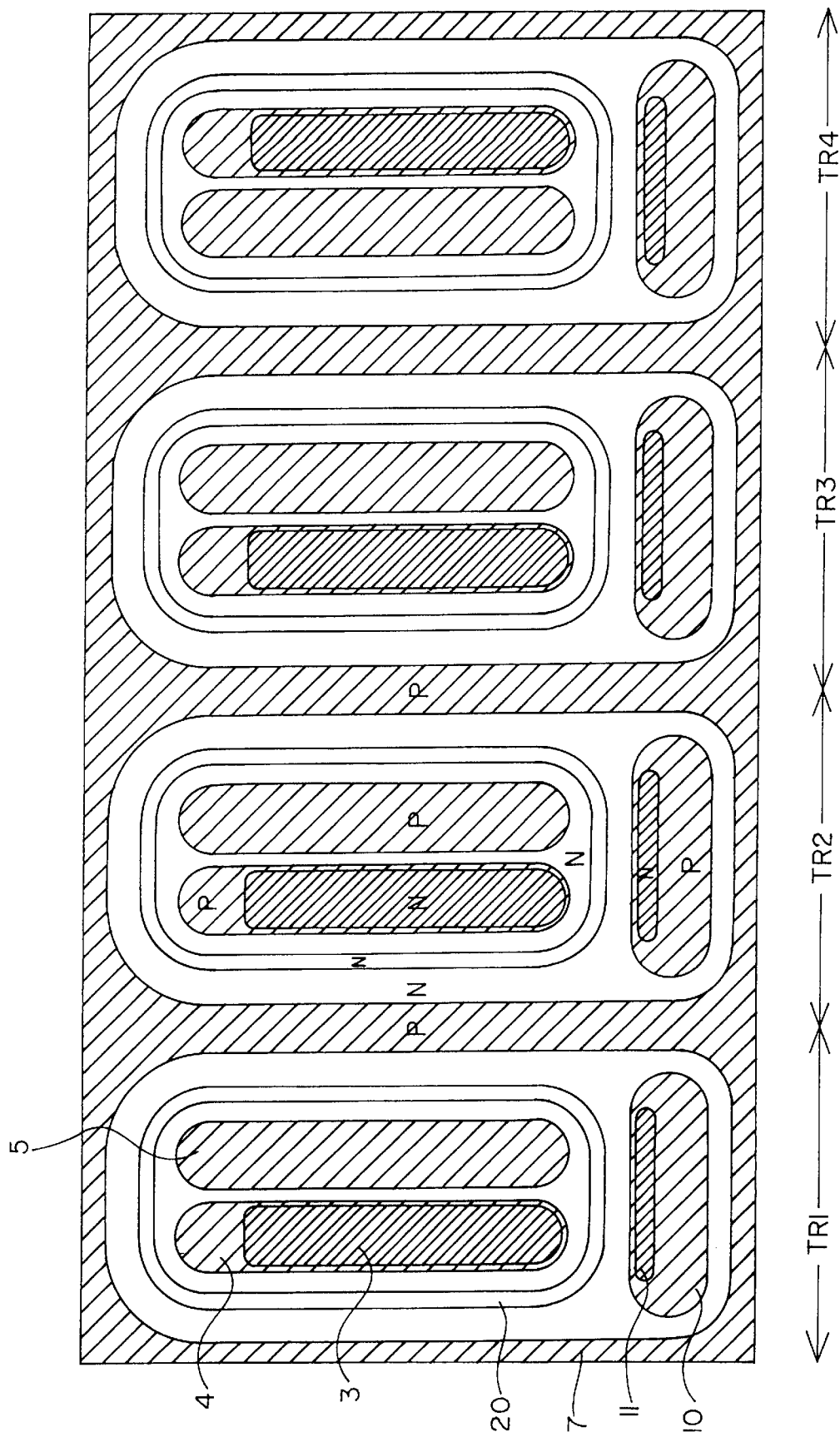
FIG. 3A is an elevational view of a triac network structure according to the present invention before performing the metallizations.
Figure 3B:
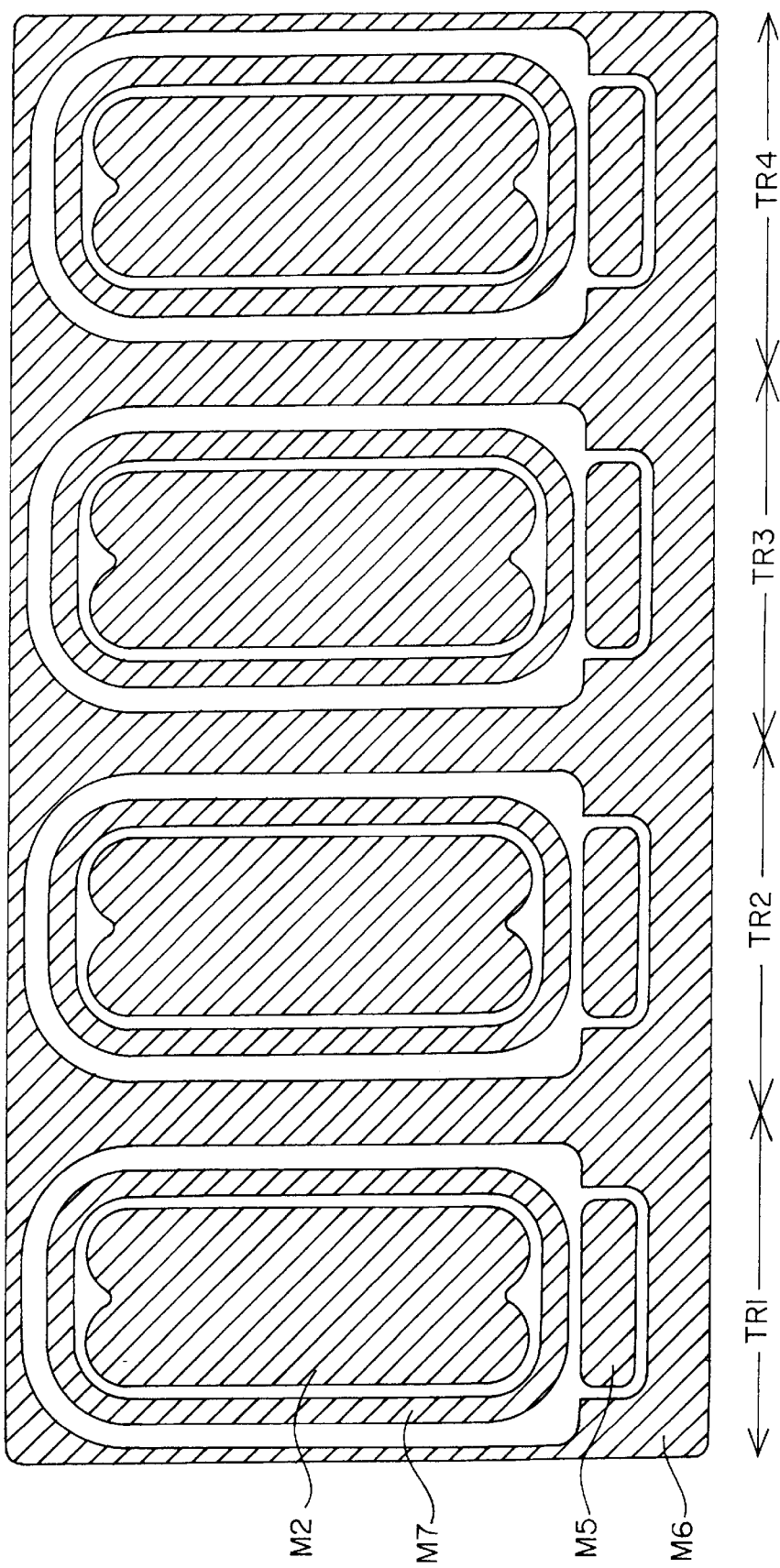
FIG. 3B is an elevational view of a triac network structure according to the present invention after performing the metallizations.

FIGS. 3A and 3B show an example of a top view of a network of triacs, each of which corresponds to the triac of FIG. 2A, and assembled according to an embodiment of the present invention. FIG. 3A is a top view before performing any metallization, and FIG. 3B is a top view illustrating the metallizations. In FIGS. 3A and 3B, four triacs TR1, TR2, TR3, and TR4 are assembled side-to-side in a same substrate. In these drawings, the same components as in FIG. 2A have been referred to by the same references.

It should be noted that regions 3, 4, and 5 have elongated and parallel shapes. An N+-type ring 20 conventionally is formed at the circumference of P wells 4 and 5 to be used as a channel stop and is coated with a metallization M7 (as depicted in FIG. 3B). This metallization M7 constitutes an equipotential plate fixing the fields on the surface.

Of course, the present invention is likely to have various alterations, modifications, and improvements which will readily occur to those skilled in the art. For example, the types of conductivity could be inverted with the biasing being modified accordingly. Furthermore, the various improvements generally used in the structures of the individual thyristors of a triac could be performed, for example the providing of emitter short-circuit areas (emitter shorts).

It should also be noted that, preferably, cathode region 6 of thyristor Th2 extends laterally beyond the projection of region 5 to avoid a desensitizing of the thyristor.

Such alterations, modifications, and improvements are intended to be within the spirit and the scope of the present invention. Accordingly, the foregoing description is by way of example only and is not intended to be limiting. The present invention is limited only as defined in the following claims and the equivalents thereto.

What is claimed is:

1. A method of controlling at least one triac, the at least one triac including a first triac having a first terminal formed on a first surface of the first triac and having second and control terminals formed on a second surface of the first triac that opposes the first surface of the first triac, the first terminal of the first triac being electrically coupled to a reference voltage terminal, the method comprising the steps of:

receiving a first voltage on the second terminal of the first triac; and applying a first control voltage that is referenced to a voltage on the first terminal of the first triac to the control terminal of the first triac to initiate conduction between the first and second terminals of the first triac.

2. The method of claim 1, wherein the at least one triac further includes a second triac having a first terminal formed on a first surface of the second triac and having second and control terminals formed on a second surface of the second triac that opposes the first surface of the second triac, the second terminal of the second triac being electrically coupled to the reference voltage terminal, the method further comprising the steps of:

receiving a second voltage on the second terminal of the second triac; and applying a second control voltage that is referenced to a voltage on the first terminal of the second triac to the control terminal of the second triac to initiate conduction between the first and second terminals of the second triac.

3. The method of claim 2, wherein a value of the first voltage is different than a value of the second voltage and the step of applying the second control voltage includes a step of applying a same voltage as the first control voltage to the control terminal of the second triac to initiate conduction between the first and second terminals of the second triac.

4. The method of claim 1, wherein the first triac includes a respective triggering transistor and the step of applying the first control voltage to the control terminal of the first triac includes a step of:

generating a base current in the respective triggering transistor of the first triac to initiate conduction between the first and second terminals of the first triac.

5. The method of claim 1, wherein the first triac includes a respective triggering transistor and the step of applying the first control voltage to the control terminal of the first triac includes a step of:

forward biasing a base to emitter junction of the respective triggering transistor of the first triac to initiate conduction between the first and second terminals of the first triac.

6. The method of claim 3, wherein the reference terminal receives a reference voltage, wherein the value of the first voltage and the value of the second voltage each is positive with respect to a value of the reference voltage, and wherein the step of applying the same voltage as the first control voltage includes a step of applying a positive voltage with respect to the value of the reference voltage.

7. The method of claim 3, wherein the reference terminal receives a reference voltage, wherein the value of the first voltage and the value of the second voltage each is positive with respect to a value of the reference voltage, and wherein the step of applying the same voltage as the first control voltage includes a step of applying a negative voltage with respect to the value of the reference voltage.

8. The method of claim 3, wherein:

the reference terminal receives a reference voltage;

the value of the first voltage is positive with respect to a value of the reference voltage;

the value of the second voltage is negative with respect to the value of the reference voltage; and the step of applying the same voltage as the first control voltage includes a step of applying a positive voltage with respect to the value of the reference voltage.

9. The method of claim 3, wherein:

the reference terminal receives a reference voltage;

the value of the first voltage is positive with respect to a value of the reference voltage;

the value of the second voltage is negative with respect to the value of the reference voltage; and the step of applying the same voltage as the first control voltage includes a step of applying a negative voltage with respect to the value of the reference voltage.

10. The method of claim 2, wherein:

the reference terminal receives a reference voltage;

a value of the first voltage and a value of the second voltage each is positive with respect to a value of the reference voltage;

the step of applying the first control voltage includes a step of applying the first control voltage having a positive value with respect to the value of the reference voltage; and the step of applying the second control voltage includes a step of applying the second control voltage having a negative value with respect to the value of the reference voltage.

11. The method of claim 2, wherein:

the reference terminal receives a reference voltage;

a value of the first voltage and a value of the second voltage each is negative with respect to a value of the reference voltage;

the step of applying the first control voltage includes a step of applying the first control voltage having a positive value with respect to the value of the reference voltage; and the step of applying the second control voltage includes a step of applying the second control voltage having a negative value with respect to the value of the reference voltage.

12. The method of claim 2, wherein:

the reference terminal receives a reference voltage;

a value of the first voltage is positive with respect to a value of the reference voltage;

a value of the second voltage is negative with respect to a value of the reference voltage;

the step of applying the first control voltage includes a step of applying the first control voltage having a positive value with respect to the value of the reference voltage; and the step of applying the second control voltage includes a step of applying the second control voltage having a positive value with respect to the value of the reference voltage.

13. The method of claim 2, wherein:

the value of the first voltage is positive with respect to a value of the reference voltage;

the value of the second voltage is negative with respect to a value of the reference voltage;

the step of applying the first control voltage includes a step of applying the first control voltage having a negative value with respect to the value of the reference voltage; and the step of applying the second control voltage includes a step of applying the second control voltage having a negative value with respect to the value of the reference voltage.

14. The method of claim 2, wherein:

the reference terminal receives a reference voltage;

a value of the first voltage is positive with respect to a value of the reference voltage;

a value of the second voltage is negative with respect to a value of the reference voltage;

the step of applying the first control voltage includes a step of applying the first control voltage having a positive value with respect to the value of the reference voltage; and the step of applying the second control voltage includes a step of applying the second control voltage having a negative value with respect to the value of the reference voltage.

15. The method of claim 2, wherein:

the reference terminal receives a reference voltage;

a value of the first voltage is positive with respect to a value of the reference voltage;

a value of the second voltage is negative with respect to a value of the reference voltage;

the step of applying the first control voltage includes a step of applying the first control voltage having a negative value with respect to the value of the reference voltage; and the step of applying the second control voltage includes a step of applying the second control voltage having a positive value with respect to the value of the reference voltage.

16. The method of claim 1, wherein the reference terminal receives a reference voltage, wherein a value of the first voltage is positive with respect to a value of the reference voltage, and wherein the step of applying includes a step of applying the first control voltage having a positive value with respect to the value of the reference voltage.

17. The method of claim 1, wherein the reference terminal receives a reference voltage, wherein a value of the first voltage is positive with respect to a value of the reference voltage, and wherein the step of applying includes a step of applying the first control voltage having a negative value with respect to the value of the reference voltage.

18. The method of claim 1, wherein a value of the first control voltage that is applied to the control terminal of the first triac to initiate conduction between the first and second terminals of the first triac is independent of a value of the first voltage received on the second terminal of the first triac.

19. The method of claim 2, wherein a value of the first and second control voltages that is respectively applied to the control terminals of the first and second triacs to initiate conduction between the first and second terminals of the first and second triacs is independent of a value of the first and second voltages received on the second terminal of the first and second triacs.

20. The method of claim 1, wherein the first and second surfaces of the first triac are formed on opposing surfaces of a single semiconductor substrate.

21. The method of claim 2, wherein the first and second surfaces of each of the first and second triacs are formed on opposing surfaces of a single semiconductor substrate.

* * * * *